(12) United States Patent
Lin et al.

(10) Patent No.: US 7,817,071 B2
(45) Date of Patent: Oct. 19, 2010

(54) LOW POWER CONSUMPTION ANALOG-TO-DIGITAL CONVERTER

(75) Inventors: Kuan-Yu Lin, Kaohsiung County (TW); Tsung-Shuen Hung, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 45 days.

(21) Appl. No.: 12/414,653

(22) Filed: Mar. 30, 2009

(65) Prior Publication Data

US 2010/0141492 A1  Jun. 10, 2010

(30) Foreign Application Priority Data

Dec. 10, 2008  (TW) ............................... 97148064 A

(51) Int. Cl.
  *H03M 1/10* (2006.01)
(52) U.S. Cl. ...................... 341/120; 341/161
(58) Field of Classification Search ................ 341/155, 341/161, 120, 118, 172
  See application file for complete search history.

(56) References Cited

U.S. PATENT DOCUMENTS 7,064,700 B1 *  6/2006  Garrity et al. ................ 341/155
7,106,240 B2 *  9/2006  Cringean .................... 341/163
7,733,261 B2 *  6/2010  Bhakta et al. ............... 341/155

OTHER PUBLICATIONS

B. Murmann et al., "A 12-b 75-MS/s pipelined ADC using open-loop residue amplification", IEEE J. Solid-State Circuits, vol. 38, No. 12, pp. 2040-2050, Dec. 2003.
E. Iroaga et al., "A 12-bit 75-MS/s pipelined ADC using incomplete Settling " IEEE J. Solid-State Circuits, vol. 42, No. 4, pp. 748-765, Apr. 2007.
T. Sepke et al., " Comparator Based switched capacitor circuits for scaled CMOS Technologies" in IEEE Int. Solid-State Circuits Conf. Dig. Tech. Papers, Feb. 2006, pp. 220-222.

* cited by examiner

*Primary Examiner*—Peguy JeanPierre
(74) *Attorney, Agent, or Firm*—Jianq Chyun IP Office

(57) ABSTRACT

A low power consumption analog-to-digital converter (ADC) is provided. The switched capacitor circuit and the operational amplifier of the pipelined stage within the present low power consumption ADC are designed to close loop, and the operational amplifier is operated at the incomplete settling of the linear settling, namely, the operational amplifier is not operated at the slew state. Therefore, the pipelined stage would not produce signal dependent distortion, such that the gain error produced by the operational amplifier could be seen as a constant gain error.

21 Claims, 3 Drawing Sheets

LOW POWER CONSUMPTION ANALOG-TO-DIGITAL CONVERTER

CROSS-REFERENCE TO RELATED APPLICATION

This application claims the priority benefit of Taiwan application serial no. 97148064, filed on Dec. 10, 2008, The entirety of the above-mentioned patent application is hereby incorporated by reference herein and made a part of specification.

BACKGROUND OF THE INVENTION

1, Field of the Invention

The present invention relates to an analog-to-digital converter (ADC), more particularly, to a low power consumption ADC.

2, Description of the Related Art

The analog-to-digital converters (ADCs) are mainly for converting a nature analog signal to a digital signal which can be processed by, for example, a digital signal processor (DSP). Since the current wireless communication and portable devices are rapidly developed, so that the ADCs with the characteristics of middle-high sampling rate and middle-high sampling resolution are popularly applied therein.

SUMMARY OF THE INVENTION

The present invention provides an analog-to-digital converter (ADC) including a first pipelined stage, a second pipelined stage, a flash ADC, a combination unit and a digital background calibration unit. The first pipelined stage is used for receiving and converting a sampled and held direct-current voltage so as to output a first digital code and a first residue voltage. The second pipelined stage is used for receiving and converting the first residue voltage so as to output a second digital code and a second residue voltage. Both of the first and the second pipelined stages include a switched capacitor circuit and an operational amplifier, wherein the switched capacitor circuit and the operational amplifier constitute a closed-loop, and the operational amplifier operates in an incomplete settling of a linear settling. The flash ADC is coupled to the second pipelined stage, and used for receiving and converting the second residue voltage so as to output a third digital code. The combination unit is coupled to the first and the second pipelined stages and the flash ADC, and used for receiving and combining the first, the second and the third digital codes so as to output an original digital signal. The digital background calibration unit is coupled to the combination unit, the first and the second pipelined stages and the flash ADC, and used for receiving the original digital signal and the first, the second and the third digital codes, and calibrating the original digital signal according to a reference digital signal and the first, the second and the third digital codes, so as to output an accuracy digital signal.

The present invention also provides an analog-to-digital converter (ADC) including a pipelined stage, a flash ADC, a combination unit and a digital background calibration unit. The pipelined stage is used for receiving and converting a sampled and held direct-current voltage so as to output a first digital code and a residue voltage. The pipelined stage includes a switched capacitor circuit and an operational amplifier, wherein the switched capacitor circuit and the operational amplifier constitute a closed-loop, and the operational amplifier operates in an incomplete settling of a linear settling. The flash ADC is coupled to the pipelined stage, and used for receiving and converting the residue voltage so as to output a second digital code. The combination unit is coupled to the pipelined stage and the flash ADC, and used for receiving and combining the first and the second digital codes so as to output an original digital signal. The digital background calibration unit is coupled to the combination unit, the pipelined stage and the flash ADC, and used for receiving the original digital signal and the first and the second digital codes, and calibrating the original digital signal according to a reference digital signal and the first and the second digital codes, so as to output an accuracy digital signal.

The present invention also provides an analog-to-digital converter (ADC) including a pipelined stage, a combination unit and a digital background calibration unit. The pipelined stage is used for receiving and converting a sampled and held direct-current voltage so as to output a first digital code and a residue voltage, and then converting the residue voltage so as to further output a second digital code. The pipelined stage includes a switched capacitor circuit and an operational amplifier. The switched capacitor circuit and the operational amplifier constitute a closed-loop, and the operational amplifier operates in an incomplete settling of a linear settling. The combination unit is coupled to the pipelined stage, and used for receiving and combining the first and the second digital codes so as to output an original digital signal. The digital background calibration unit is coupled to the combination unit and the pipelined stage, and used for receiving the original digital signal and the first and the second digital codes, and calibrating the original digital signal according to a reference digital signal and the first and the second digital codes, so as to output an accuracy digital signal.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
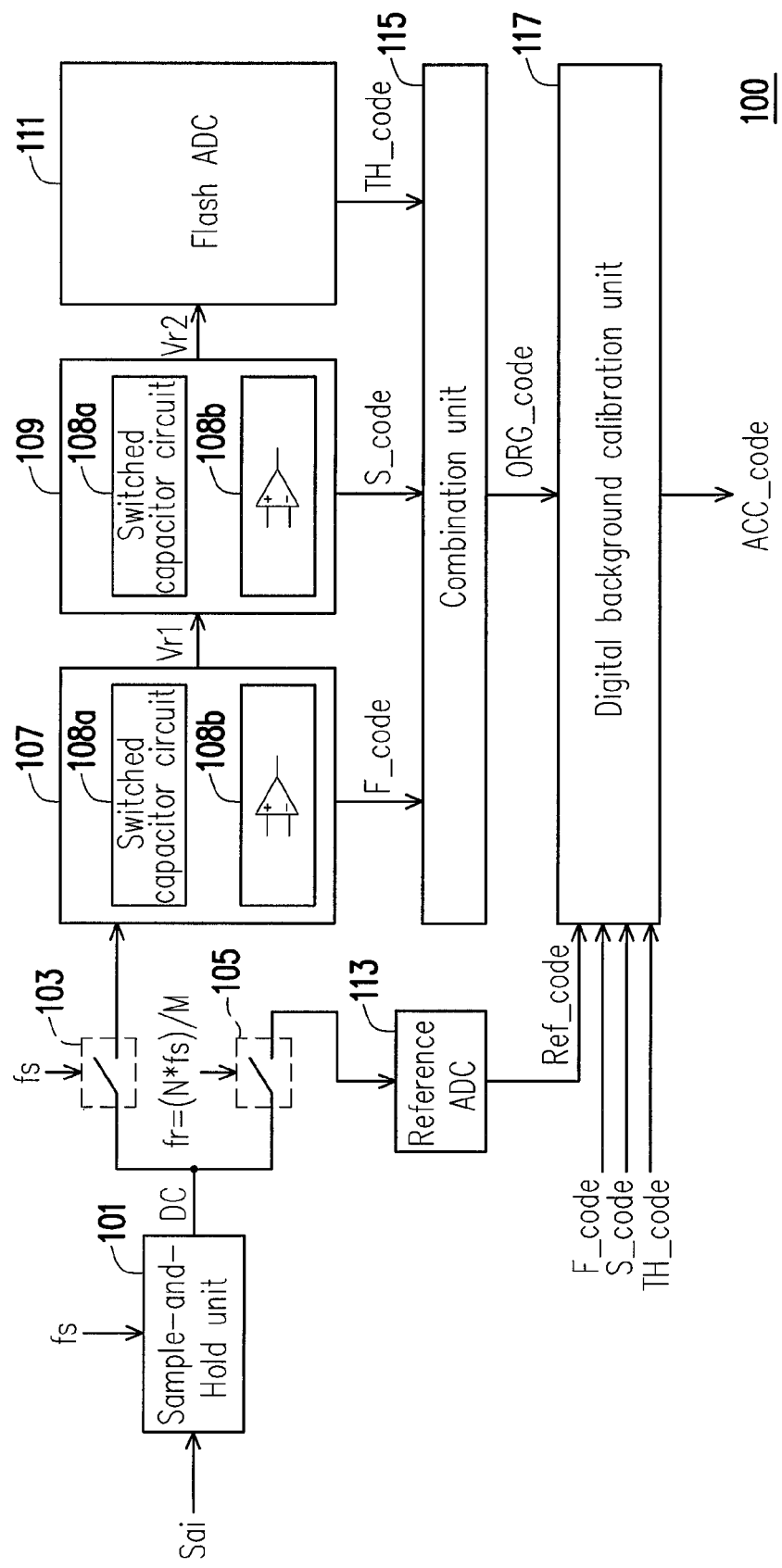
FIG. 1 is a block diagram of a pipelined ADC according to an exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a block diagram of a pipelined analog-to-digital converter (ADC) 100 according to an exemplary embodiment of the present invention. Referring to FIG. 1, the pipelined ADC 100 includes a sample-and-hold unit 101, two switches 103 and 105, at least two pipelined stages 107 and 109, a flash ADC 111, a reference ADC 113, a combination unit 115 and a digital background calibration unit 117.

In the exemplary embodiment, the sample-and-hold unit 101 is used for receiving an input analog signal Sai, and sampling and holding the input analog signal Sai according to a sampling frequency fs, so as to output a sampled and held direct-current voltage DC. One terminal of the switch 103 is coupled to the sample-and-hold unit 101, and another terminal of the switch 103 is coupled to the pipelined stage 107. The switch 103 is controlled by the sampling frequency fs and used for providing the sampled and held direct-current voltage DC to the pipelined stage 107.

One terminal of the switch 105 is coupled to the sample-and-hold unit 101, and another terminal of the switch 105 is coupled to the reference ADC 113. The switch 105 is controlled by a reference frequency fr, and used for providing the sampled and held direct-current voltage DC to the reference ADC 113, wherein the reference frequency fr is a N/M time of the sampling frequency fs (i.e. fr=(N*fs)/M), where M and N are a positive integer. The reference ADC 113 is used for performing an analog-to-digital conversion to the sampled and held direct-current voltage DC provided by the switch 105, so as to provide the reference digital signal Ref_code.

The pipelined stage 107 is used for receiving and converting the sampled and held direct-current voltage DC provided by the switch 103 so as to output a digital code F_code and a residue voltage Vr1. The pipelined stage 109 is used for receiving and converting the residue voltage Vr1 output from the pipelined stage 107, so as to output a digital code S_code and a residue voltage Vr2.

In the exemplary embodiment, both of the pipelined stages 107 and 109 include a switched capacitor circuit 108a and an operational amplifier 108b, wherein the switched capacitor circuit 108a of the pipelined stage 107 is composed of a plurality of capacitors and switches, and the number of these capacitors and the switches is determined by the bits of the digital code F_code analyzed from the pipelined stage 107.

Similarly, the switched capacitor circuit 108a of the pipelined stage 109 is composed of a plurality of capacitors and switches, and the number of these capacitors and the switches is determined by the bits of the digital code S_code analyzed from the pipelined stage 109. However, such technology is known by one person having ordinary skilled in the art, so that it does not describe in detail herein. In addition, the switched capacitor circuit 108a and the operational amplifier 108b of the pipelined stages 107 and 109 constitute a closed-loop, and the operational amplifier 108b of the pipelined stages 107 and 109 operates in the incomplete settling of the linear settling.

The flash ADC 111 is coupled to the pipelined stage 109, and used for receiving and converting the residue voltage Vr2 so as to output a digital code TH_code. The combination unit 115 is coupled to the pipelined stages 107 and 109, and the flash ADC 111. The combination unit I 15 is used for receiving and combining the digital codes F_code, S_code and TH_code, so as to output an original digital signal ORG_code.

The digital background calibration unit 117 is coupled to the reference. ADC 113, the combination unit 115, the pipelined stages 107 and 109, and the flash ADC 111. The digital background calibration unit 117 is used for receiving the original digital signal ORG_code and the digital codes F_code, S_code and TH_code, and calibrating the original digital signal ORG_code according to the reference digital signal Ref_code and the digital codes F_code, S_code and TH_code, so as to output an accuracy digital signal ACC_code.

In the exemplary embodiment, the digital background calibration unit 117 would be implemented by an adaptive filter which would be used for receiving the original digital signal ORG_code, the reference digital signal Ref_code and the digital codes F_code, S_code and TH_code, and reducing the frequency of the original digital signal ORG_code by N/M times to subtract with the reference digital signal Ref_code, so as to obtain an error function for coordinating-with the digital codes F_code, S_code and TH_code to perform a self training mechanism, thereby calibrating the original digital signal ORG_code to output the accuracy digital signal ACC_code.

From the above, since the switched capacitor circuit 108a and the operational amplifier 108b of the pipelined stages 107 and 109 constitute the closed-loop, and the operational amplifier 108b of the pipelined stages 107 and 109 operates in the incomplete settling of the linear settling, namely, the operational amplifier 108b of the pipelined stages 107 and 109 does not operate in the slew state. Accordingly, the pipelined stages 107 and 109 would not produce signal dependent distortion, so that the gain error produced by the operational amplifier 108b of the pipelined stages 107 and 109 could be seen as a constant gain error.

Thereupon, the digital background calibration unit 117 would calibrate the original digital signal ORG_code according to the reference digital signal Ref_code and the digital codes F_code, S_code and TH_code, so as to output the accuracy digital signal ACC_code. Besides, since the operational amplifier 108b of the pipelined stages 107 and 109 operates in the incomplete settling of the linear settling, such that the band width requirement of the operational amplifier 108b of the pipelined stages 107 and 109 could be substantially reduced, but it does not affect the whole performance of the pipelined ADC 100.

In the other exemplary embodiments of the present invention, the pipelined stage 107 would receive the input analog signal Sai by its inner sample-and-hold unit (not shown), such that the sample-and-hold unit 101 would be omitted accordingly. In addition, even though the above exemplary embodiment adopts the digital background calibration unit 117 requiring the reference digital signal Ref_code to calibrate the original digital signal ORG_code, but the other exemplary embodiments of the present invention would adopt the digital background calibration technology, which does not require the reference digital signal Ref_code, to calibrate the original digital signal ORG_code, such that the reference ADC 113 would be omitted accordingly.

Furthermore, even though only two pipelined stages 107 and 109 are explained by the above exemplary embodiment, but one person having ordinary skilled in the art should analogize the embodiments with two more pipelined stages by referring the teaching of the above exemplary embodiment. All of the variation exemplary embodiments according to the above teaching and suggestion would fall in the scope of the present invention.

Figure 2:
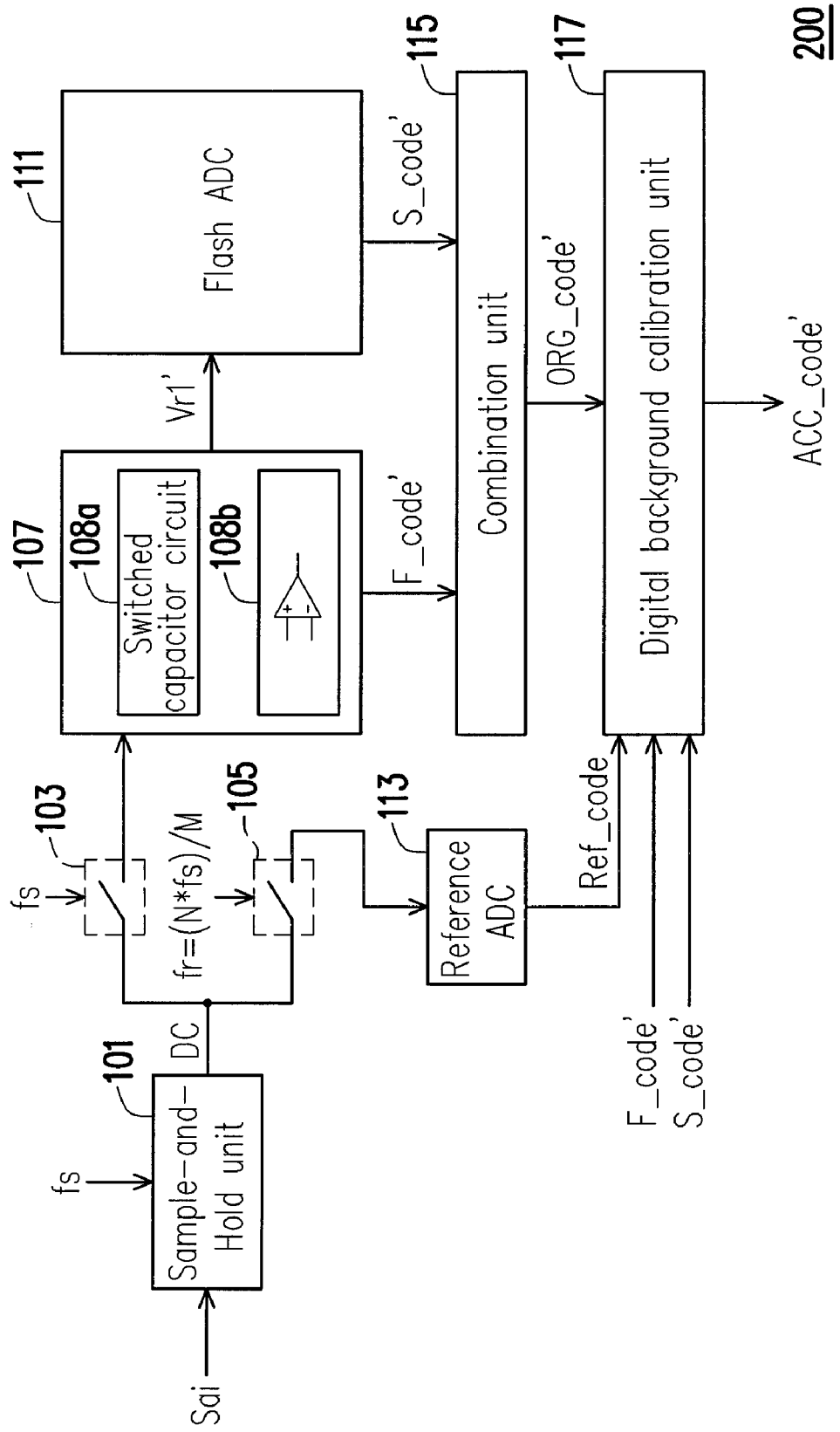
FIG. 2 is a block diagram of a two-step ADC according to an exemplary embodiment of the present invention.

FIG. 2 is a block diagram of a two-step ADC 200 according to an exemplary embodiment of the present invention. Referring to FIG. 2, the two-step ADC 200 includes a sample-and-hold unit 101, two switches 103 and 105, one pipelined stage 107, a flash ADC 111, a reference ADC 113, a combination unit 115 and a digital background calibration unit 117.

In the exemplary embodiment, the sample-and-hold unit 101 is used for receiving an input analog signal Sai, and sampling and holding the input analog signal Sai according to a sampling frequency fs, so as to output a sampled and held direct-current voltage DC. One terminal of the switch 103 is coupled to the sample-and-hold unit 101, and another terminal of the switch 103 is coupled to the pipelined stage 107. The switch 103 is controlled by the sampling frequency fs and used for providing the sampled and held direct-current voltage DC to the pipelined stage 107.

One terminal of the switch 105 is coupled to the sample-and-hold unit 101, and another terminal of the switch 105 is coupled to the reference ADC 113. The switch 105 is controlled by a reference frequency fr, and used for providing the sampled and held direct-current voltage DC to the reference ADC 113, wherein the reference frequency fr is a N/M time of the sampling frequency fs (i.e. fr=(N*fs)/M), where M and N are a positive integer. The reference ADC 113 is used for performing an analog-to-digital conversion to the sampled and held direct-current voltage DC provided by the switch 105, so as to provide the reference digital signal Ref_code.

The pipelined stage 107 is used for receiving and converting the sampled and held direct-current voltage DC provided by the switch 103 so as to output a digital code F_code' and a residue voltage Vr1'. In the exemplary embodiment, the pipelined stage 107 includes a switched capacitor circuit 108*a* and an operational amplifier 108*b*, wherein the switched capacitor circuit 108*a* of the pipelined stage 107 is composed of a plurality of capacitors and switches, and the number of these capacitors and the switches is determined by the bits of the digital code F_code' analyzed from the pipelined stage 107.

However, such technology is known by one person having ordinary skilled in the art, so that it does not describe in detail herein. In addition, the switched capacitor circuit 108*a* and the operational amplifier 108*b* of the pipelined stage 107 constitute a closed-loop, and the operational amplifier 108*b* of the pipelined stage 107 operates in the incomplete settling of the linear settling.

The flash ADC 111 is coupled to the pipelined stage 107, and used for receiving and converting the residue voltage Vr1' so as to output a digital code S_code'. The combination unit 115 is coupled to the pipelined stage 107 and the flash ADC 111. The combination unit 115 is used for receiving and combining the digital codes F_code' and S_code', so as to output an original digital signal ORG_code'.

The digital background calibration unit 117 is coupled to the reference ADC 113, the combination unit 115, the pipelined stage 107, and the flash ADC 111. The digital background calibration unit 117 is used for receiving the original digital signal ORG_code' and the digital codes F_code' and S_code', and calibrating the original digital signal ORG_code' according to the reference digital signal Ref_code and the digital codes F_code' and S_code', so as to output an accuracy digital signal $ACC\_code'$.

In the exemplary embodiment, the digital background calibration unit 117 would be implemented by an adaptive filter which would be used for receiving the original digital signal ORG_code', the reference digital signal Ref_code and the digital codes F_code' and S_code', and reducing the frequency of the original digital signal ORG_code' by N/M times to subtract with the reference digital signal Ref_code, so as to obtain an error function for coordinating with the digital codes F_code' and S_code' to perform a self training mechanism, thereby calibrating the original digital signal ORG_code' to output the accuracy digital signal ACC_code'.

From the above, since the switched capacitor circuit 108*a* and the operational amplifier 108*b* of the pipelined stage 107 constitute the closed-loop, and the operational amplifier 108*b* of the pipelined stage 107 operates in the incomplete settling of the linear settling, namely, the operational amplifier 108*b* of the pipelined stage 107 does not operate in the slew state. Accordingly, the pipelined stage 107 would not produce signal dependent distortion, so that the gain error produced by the operational amplifier 108*b* of the pipelined stage 107 could be seen as a constant gain error.

Thereupon, the digital background calibration unit 117 would calibrate the original digital signal ORG_code' according to the reference digital code Ref_code and the digital codes F_code' and S_code', so as to output the accuracy digital signal ACC_code'. Besides, since the operational amplifier 108*b* of the pipelined stage 107 operates in the incomplete settling of the linear settling, such that the band width requirement of the operational amplifier 108*b* of the pipelined stage 107 could be substantially reduced, but it does not affect the whole performance of the two-step ADC 200.

In the other exemplary embodiments of the present invention, the pipelined stage 107 would receive the input analog signal Sai by its inner sample-and-hold unit (not shown), such that the sample-and-hold unit 101 would be omitted accordingly. In addition, even though the above exemplary embodiment adopts the digital background calibration unit 117 requiring the reference digital signal Ref_code to calibrate the original digital signal ORG_code', but the other exemplary embodiments of the present invention would adopt the digital background calibration technology, which does not require the reference digital signal Ref_code, to calibrate the original digital signal ORG_code', such that the reference ADC 113 would be omitted accordingly. All of the variation exemplary embodiments according to the above teaching and suggestion would fall in the scope of the present invention.

Figure 3:
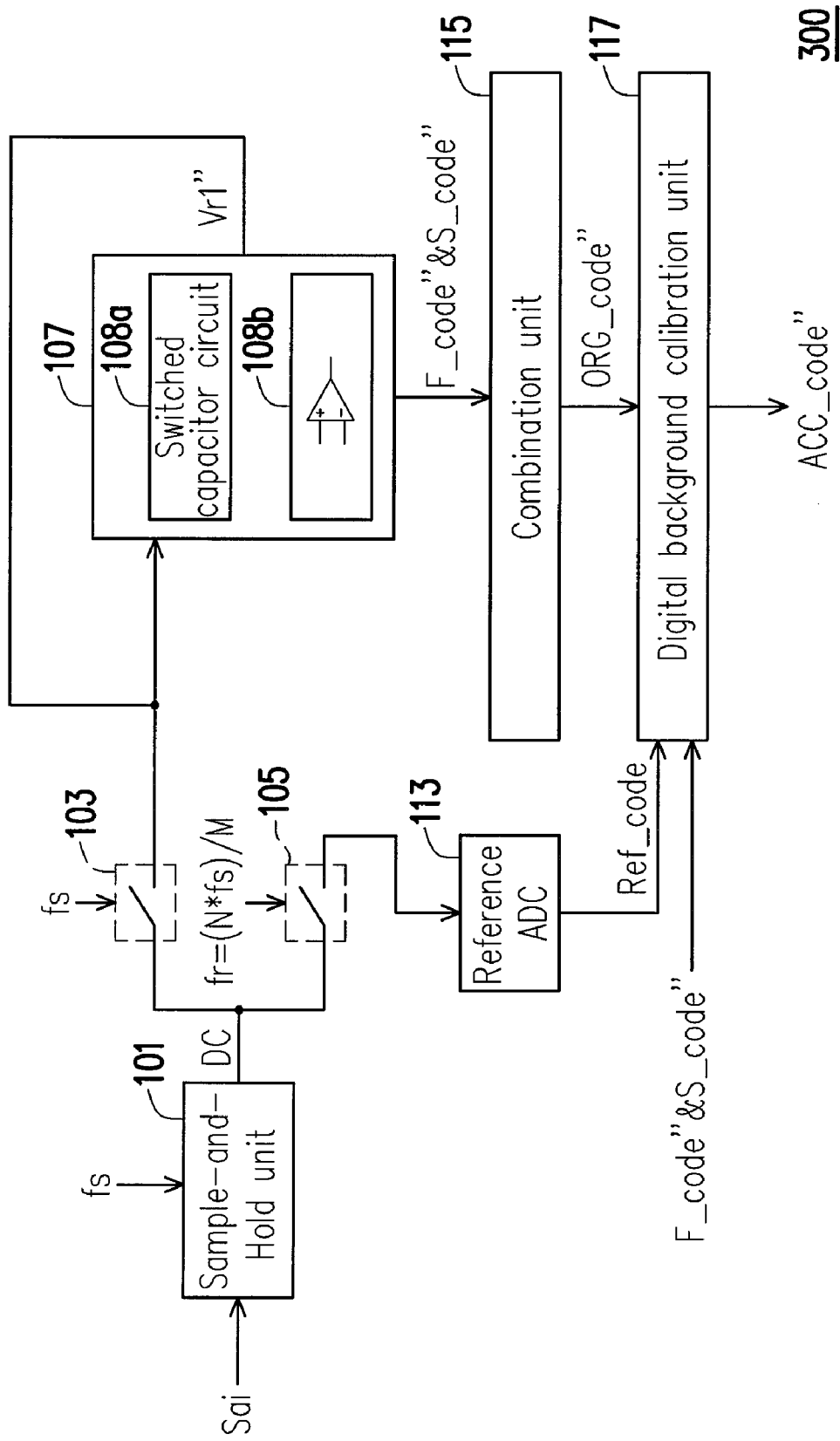
FIG. 3 is a block diagram of a cyclic ADC according to an exemplary embodiment of the present invention.

FIG. 3 is a block diagram of a cyclic ADC 300 according to an exemplary embodiment of the present invention. Referring to FIG. 3, the cyclic ADC 300 includes a sample-and-hold unit 101, two switches 103 and 105, one pipelined stage 107, a reference ADC 113, a combination unit 115 and a digital background calibration unit 117.

In the exemplary embodiment, the sample-and-hold unit 101 is used for receiving an input analog signal Sai, and sampling and holding the input analog signal Sai according to a sampling frequency fs, so as to output a sampled and held direct-current voltage DC. One terminal of the switch 103 is coupled to the sample-and-hold unit 101, and another terminal of the switch 103 is coupled to the pipelined stage 107. The switch 103 is controlled by the sampling frequency fs and used for providing the sampled and held direct-current voltage DC to the pipelined stage 107.

One terminal of the switch 105 is coupled to the sample-and-hold unit 101, and another terminal of the switch 105 is coupled to the reference ADC 113. The switch 105 is controlled by a reference frequency fr, and used for providing the sampled and held direct-current voltage DC to the reference ADC 113, wherein the reference frequency fr is a N/M time of the sampling frequency fs (i.e. fr=(N*fs)/M), where M and N are a positive integer. The reference ADC 113 is used for performing an analog-to-digital conversion to the sampled and held direct-current voltage DC provided by the switch 105, so as to provide the reference digital signal Ref_code.

The pipelined stage 107 is used for receiving and converting the sampled and held direct-current voltage DC provided by the switch 103 so as to output a digital code F_code" and a residue voltage Vr1", and then converting the residue voltage Vr1" (i.e. the residue voltage Vr1" would be feedback) so as to further output a digital code S_code". In the exemplary embodiment, the pipelined stage 107 includes a switched capacitor circuit 108*a* and an operational amplifier 108*b*, wherein the switched capacitor circuit 108*a* of the pipelined stage 107 is composed of a plurality of capacitors and switches, and the number of these capacitors and the switches is determined by the bits of the digital code F_code" and S_code" analyzed from the pipelined stage 107.

However, such technology is known by one person having ordinary skilled in the art, so that it does not describe in detail herein. In addition, the switched capacitor circuit 108*a* and the operational amplifier 108*b* of the pipelined stage 107 constitute a closed-loop, and the operational amplifier 108b of the pipelined stage 107 operates in the incomplete settling of the linear settling.

The combination unit 115 is used for receiving and combining the digital codes F_code" and S_code", so as to output an original digital signal ORG_code". The digital background calibration unit 117 is coupled to the reference ADC 113, the combination unit 115 and the pipelined stage 107. The digital background calibration unit 117 is used for receiving the original digital signal ORG_code" and the digital codes F_code" and S_code", and calibrating the original digital signal ORG_code" according to the reference digital signal Ref_code and the digital codes F_code" and S_code", so as to output an accuracy digital signal ACC_code".

In the exemplary embodiment, the digital background calibration unit 117 would be implemented by an adaptive filter which would be used for receiving the original digital signal ORG_code", the reference digital signal Ref_code and the digital codes F_code" and S_code", and reducing the frequency of the original digital signal ORG_code" by N/M times to subtract with the reference digital signal Ref_code, so as to obtain an error function for coordinating with the digital codes F_code" and S_code" to perform a self training mechanism, thereby calibrating the original digital signal ORG_code" to output the accuracy digital signal ACC_code".

From the above, since the switched capacitor circuit 108a and the operational amplifier 108b of the pipelined stage 107 constitute the closed-loop, and the operational amplifier 108b of the pipelined stage 107 operates in the incomplete settling of the linear settling, namely, the operational amplifier 108b of the pipelined stage 107 does not operate in the slew state. Accordingly, the pipelined stage 107 would not produce signal dependent distortion, so that the gain error produced by the operational amplifier 108b of the pipelined stage 107 could be seen as a constant gain error.

Thereupon, the digital background calibration unit 117 would calibrate the original digital signal ORG_code" according to the reference digital signal Ref_code and the digital codes F_code" and S_code", so as to output the accuracy digital signal ACC_code". Besides, since the operational amplifier 108b of the pipelined stage 107 operates in the incomplete settling of the linear settling, such that the band width requirement of the operational amplifier 108b of the pipelined stage 107 could be substantially reduced, but it does not affect the whole performance of the cyclic ADC 300.

In the other exemplary embodiments of the present invention, the pipelined stage 107 would receive the input analog signal Sai by its inner sample-and-hold unit (not shown), such that the sample-and-hold unit 101 would be omitted accordingly. In addition, even though the above exemplary embodiment adopts the digital background calibration unit 117 requiring the reference digital signal Ref_code to calibrate the original digital signal ORG_code", but the other exemplary embodiments of the present invention would adopt the digital background calibration technology, which does not require the reference digital signal Ref_code, to calibrate the original digital signal ORG_code", such that the reference ADC 113 would be omitted accordingly. All of the variation exemplary embodiments according to the above teaching and suggestion would fall in the scope of the present invention.

In summary, the switched capacitor circuit and the operational amplifier applied to the pipelined stage within each type of the present ADCs are designed to closed-loop, and the operational amplifier is operated in the incomplete settling of the linear settling, namely, the operational amplifier is not operated in the slew state. Therefore, the pipelined stage would not produce signal dependent distortion, so that the gain error produced by the operational amplifier could be seen as a constant gain error. Thereupon, the digital background calibration unit would calibrate the original digital signal according to the reference digital signal provided by the reference ADC so as to output the accuracy digital signal.

In addition, since the operational amplifier of the pipelined stage operates in the incomplete settling of the linear settling, such that the band width requirement of the operational amplifier of the pipelined stage could be substantially reduced, but it does not affect the whole performance of each type of the present ADCs.

It will be apparent to those skills in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An analog-to-digital converter (ADC), comprising:
  a first pipelined stage, for receiving and converting a sampled and held direct-current voltage so as to output a first digital code and a first residue voltage; and
  a second pipelined stage, for receiving and converting the first residue voltage so as to output a second digital code and a second residue voltage, wherein both of the first and the second pipelined stages comprise:
    a switched capacitor circuit; and
    an operational amplifier, constituting a closed-loop with the switched capacitor circuit, and operating in an incomplete settling of a linear settling; and
  a flash ADC, coupled to the second pipelined stage, for receiving and converting the second residue voltage so as to output a third digital code;
  a combination unit, coupled to the first and the second pipelined stages and the flash ADC, for receiving and combining the first, the second and the third digital codes so as to output an original digital signal; and
  a digital background calibration unit, coupled to the combination unit, the first and the second pipelined stages and the flash ADC, for receiving the original digital signal and the first, the second and the third digital codes, and calibrating the original digital signal according to a reference digital signal and the first, the second and the third digital codes, so as to output an accuracy digital signal.

2. The ADC according to claim 1, further comprising:
  a sample-and-hold unit, for receiving an input analog signal, and sampling and holding the input analog signal according to a sampling frequency, so as to output the sampled and held direct-current voltage.

3. The ADC according to claim 2, further comprising:
  a first switch, having one terminal coupled to the sample-and-hold unit, and another terminal thereof coupled to the first pipelined stage,
  wherein the first switch is controlled by the sampling frequency, and used for providing the sampled and held direct-current voltage to the first pipelined stage.

4. The ADC according to claim 2, further comprising:
  a reference ADC, coupled to the digital background calibration unit and the sample-and-hold unit, for performing an analog-to-digital conversion to the sampled and held direct-current voltage, so as to provide the reference digital signal.

5. The ADC according to claim 4, further comprising:
a second switch, having one terminal coupled to the sample-and-hold unit, and another terminal thereof coupled to the reference ADC,
wherein the second switch is controlled by a reference frequency, and used for providing the sampled and held direct-current voltage to the reference ADC, the reference frequency is a N/M time of the sampling frequency, where M and N are a positive integer.

6. The ADC according to claim 5, wherein the digital background calibration unit comprises:
an adaptive filter, coupled to the combination unit, the reference ADC, the first and the second pipelined stages and the flash ADC, for receiving the original digital signal, the reference digital signal and the first, the second and the third digital codes, and reducing a frequency of the original digital signal by N/M times to subtract with the reference digital signal, so as to obtain an error function for coordinating with the first, the second and the third digital codes to perform a self training mechanism, thereby calibrating the original digital signal to output the accuracy digital signal.

7. The ADC according to claim 1, wherein the ADC is a pipelined ADC.

8. An analog-to-digital converter (ADC), comprising:
a pipelined stage, for receiving and converting a sampled and held direct-current voltage so as to output a first digital code and a residue voltage, wherein the pipelined stage comprises:
a switched capacitor circuit; and
an operational amplifier, constituting a closed-loop with the switched capacitor circuit, and operating in an incomplete settling of a linear settling; and
a flash ADC, coupled to the pipelined stage, for receiving and converting the residue voltage so as to output a second digital code;
a combination unit, coupled to the pipelined stage and the flash ADC, for receiving and combining the first and the second digital codes so as to output an original digital signal; and
a digital background calibration unit, coupled to the combination unit, the pipelined stage and the flash ADC, for receiving the original digital signal and the first and the second digital codes, and calibrating the original digital signal according to a reference digital signal and the first and the second digital codes, so as to output an accuracy digital signal.

9. The ADC according to claim 8, further comprising:
a sample-and-hold unit, for receiving an input analog signal, and sampling and holding the input analog signal according to a sampling frequency, so as to output the sampled and held direct-current voltage.

10. The ADC according to claim 9, further comprising:
a first switch, having one terminal coupled to the sample-and-hold unit, and another terminal thereof coupled to the pipelined stage,
wherein the first switch is controlled by the sampling frequency, and used for providing the sampled and held direct-current voltage to the pipelined stage.

11. The ADC according to claim 9, further comprising:
a reference ADC, coupled to the digital background calibration unit and the sample-and-hold unit, for performing an analog-to-digital conversion to the sampled and held direct-current voltage, so as to provide the reference digital signal.

12. The ADC according to claim 11, further comprising:
a second switch, having one terminal coupled to the sample-and-hold unit, and another terminal thereof coupled to the reference ADC,
wherein the second switch is controlled by a reference frequency, and used for providing the sampled and held direct-current voltage to the reference ADC, the reference frequency is a N/M time of the sampling frequency, where M and N are a positive integer.

13. The ADC according to claim 12, wherein the digital background calibration unit comprises:
an adaptive filter, coupled to the combination unit, the reference ADC, the pipelined stage and the flash ADC, for receiving the original digital signal, the reference digital signal and the first and the second digital code, and reducing a frequency of the original digital signal by N/M times to subtract with the reference digital signal, so as to obtain an error function for coordinating with the first and the second digital codes to perform a self training mechanism, thereby calibrating the original digital signal to output the accuracy digital signal.

14. The ADC according to claim 8, wherein the ADC is a two-step ADC.

15. An analog-to-digital converter (ADC), comprising:
a pipelined stage, for receiving and converting a sampled and held direct-current voltage so as to output a first digital code and a residue voltage, and then converting the residue voltage so as to further output a second digital code, wherein the pipelined stage comprises:
a switched capacitor circuit; and
an operational amplifier, constituting a closed-loop with the switched capacitor circuit, and operating in an incomplete settling of a linear settling; and
a combination unit, coupled to the pipelined stage, for receiving and combining the first and the second digital codes so as to output an original digital signal; and
a digital background calibration unit, coupled to the combination unit and the pipelined stage, for receiving the original digital signal and the first and the second digital codes, and calibrating the original digital signal according to a reference digital signal and the first and the second digital codes, so as to output an accuracy digital signal.

16. The ADC according to claim 15, further comprising:
a sample-and-hold unit, for receiving an input analog signal, and sampling and holding the input analog signal according to a sampling frequency, so as to output the sampled and held direct-current voltage.

17. The ADC according to claim 16, further comprising:
a first switch, having one terminal coupled to the sample-and-hold unit, and another terminal thereof coupled to the pipelined stage,
wherein the first switch is controlled by the sampling frequency, and used for providing the sampled and held direct-current voltage to the pipelined stage.

18. The ADC according to claim 16, further comprising:
a reference ADC, coupled to the digital background calibration unit and the sample-and-hold unit, for performing an analog-to-digital conversion to the sampled and held direct-current voltage, so as to provide the reference digital signal.

19. The ADC according to claim 18, further comprising:
a second switch, having one terminal coupled to the sample-and-hold unit, and another terminal thereof coupled to the reference ADC,
wherein the second switch is controlled by a reference frequency, and used for providing the sampled and held direct-current voltage to the reference ADC, the reference frequency is a N/M time of the sampling frequency, where M and N are a positive integer.

20. The ADC according to claim 19, wherein the digital background calibration unit comprises:

an adaptive filter, coupled to the combination unit, the reference ADC and the pipelined stage, for receiving the original digital signal, the reference digital signal and the first and the second digital code, and reducing a frequency of the original digital signal by N/M times to subtract with the reference digital signal, so as to obtain an error function for coordinating with the first and the second digital codes to perform a self training mechanism, thereby calibrating the original digital signal to output the accuracy digital signal.

21. The ADC according to claim 15, wherein the ADC is a cyclic ADC.

* * * * *